(12) United States Patent
Simper et al.

(10) Patent No.: US 8,987,948 B2
(45) Date of Patent: Mar. 24, 2015

(54) BUS BAR ASSEMBLY

(75) Inventors: Norbert J. Simper, Bissingen (DE); Rainer Seidel, Tussenhausen (DE)

(73) Assignee: Hamilton Sundstrand Corporation, Windsor Locks, CT (US)

( * ) Notice: Subject to any disclaimer, the term of this patent is extended or adjusted under 35 U.S.C. 154(b) by 944 days.

(21) Appl. No.: 12/825,400

(22) Filed: Jun. 29, 2010

(65) Prior Publication Data

US 2011/0188174 A1 Aug. 4, 2011

Related U.S. Application Data

(60) Provisional application No. 61/337,273, filed on Feb. 2, 2010.

(51) Int. Cl.
*H01H 47/00* (2006.01)
*H05K 7/14* (2006.01)
*H01H 85/046* (2006.01)

(52) U.S. Cl.
CPC ............ *H05K 7/1432* (2013.01); *H01H 85/046* (2013.01)
USPC .......................................... 307/125; 307/9.1

(58) Field of Classification Search
USPC ............................. 361/760; 307/113, 9.1, 125
See application file for complete search history.

(56) References Cited

U.S. PATENT DOCUMENTS

| | | | |
|---|---|---|---|
| 4,274,701 A | 6/1981 | Bannert et al. | |
| 4,599,679 A | 7/1986 | Baader | |
| 4,628,219 A | 12/1986 | Troscinski | |
| 4,689,718 A | 8/1987 | Maue et al. | |
| 4,842,534 A | 6/1989 | Mobley et al. | |
| 4,845,589 A | 7/1989 | Weidler et al. | |
| 4,931,898 A | 6/1990 | Cole | |
| 5,017,859 A * | 5/1991 | Engel et al. | 324/127 |
| 5,179,503 A | 1/1993 | Fouts et al. | |
| 5,462,444 A | 10/1995 | Korsunsky et al. | |
| 5,463,252 A * | 10/1995 | Jones et al. | 257/723 |
| 5,831,550 A * | 11/1998 | Sigiliao Da Costa et al. | 340/870.05 |
| 7,538,540 B2 * | 5/2009 | Tsukamoto | 324/117 R |
| 7,583,072 B2 * | 9/2009 | Muraki et al. | 324/117 H |
| 2004/0027734 A1 * | 2/2004 | Fairfax et al. | 361/2 |
| 2007/0188997 A1 * | 8/2007 | Hockanson et al. | 361/760 |
| 2009/0200864 A1 | 8/2009 | Maier | |

OTHER PUBLICATIONS

Vagnon et al., "A Busbar Like Power Module Based on 3D Chip on Chip Hybrid Integration," Applied Power Electronics Conference and Exposition, 2009. APEC 2009. Twenty-Fourth Annual IEEE, vol., No., pp. 2072-2078, Feb. 15-19, 2009.*

* cited by examiner

*Primary Examiner* — Daniel Cavallari
(74) *Attorney, Agent, or Firm* — Carlson, Gaskey & Olds, P.C.

(57) ABSTRACT

A solid state contactor assembly includes at least one solid state switch electrically connected to a first bus bar via at least one conductive plate. The solid state switch controls a flow of current between the first bus bar and a second bus bar. A current sensor is formed along a cross section of one of the first or second bus bar such that the current sensor separates its associated bus bar into two separate bus bar portions, and such that a flow of current between the two separate bus bar portions passes through the current sensor. A switch control is operable to control the solid state switch. The switch control is in communication with the current sensor.

17 Claims, 5 Drawing Sheets

BUS BAR ASSEMBLY

The application claims priority to U.S. Provisional Application No. 61/337,273 which was filed on Feb. 2, 2010.

BACKGROUND

This disclosure relates to bus bars, and more particularly to a bus bar current sensor, a bus bar current switch, and to bus bar connection and retention.

Bus bars have been used with electromechanical contactors to form electrical connections between devices in an aircraft electrical system. In a typical aircraft electrical power distribution system, power is fed to distribution boxes/panels by heavy gauge wires which are bolted to terminal blocks, and the terminal blocks are bolted to internal bus bars of the distribution box/panel. Electromechanical contactors are used to provide electrical connections between some of these components. However, the electromechanical contractors are large, heavy and costly, and replacing worn out electromechanical contactors can be difficult.

SUMMARY

A solid state contactor assembly includes at least one solid state switch electrically connected to a first bus bar via at least one conductive plate. The solid state switch controls a flow of current between the first bus bar and a second bus bar. A current sensor is formed along a cross section of one of the first or second bus bar such that the current sensor separates its associated bus bar into two separate bus bar portions, and such that a flow of current between the two separate bus bar portions passes through the current sensor. A switch control is operable to control the solid state switch. The switch control is in communication with the current sensor.

In one example a bus bar assembly includes a bus bar having an end portion. The end portion of the bus bar has a conductive coating and is sized to be received into a receptacle. A retaining arm extends from the receptacle and secures the bus bar end portion into the receptacle without passing any fasteners through the conductive coating.

These and other features of the present invention can be best understood from the following specification and drawings, the following of which is a brief description.

DETAILED DESCRIPTION

Figure 1:
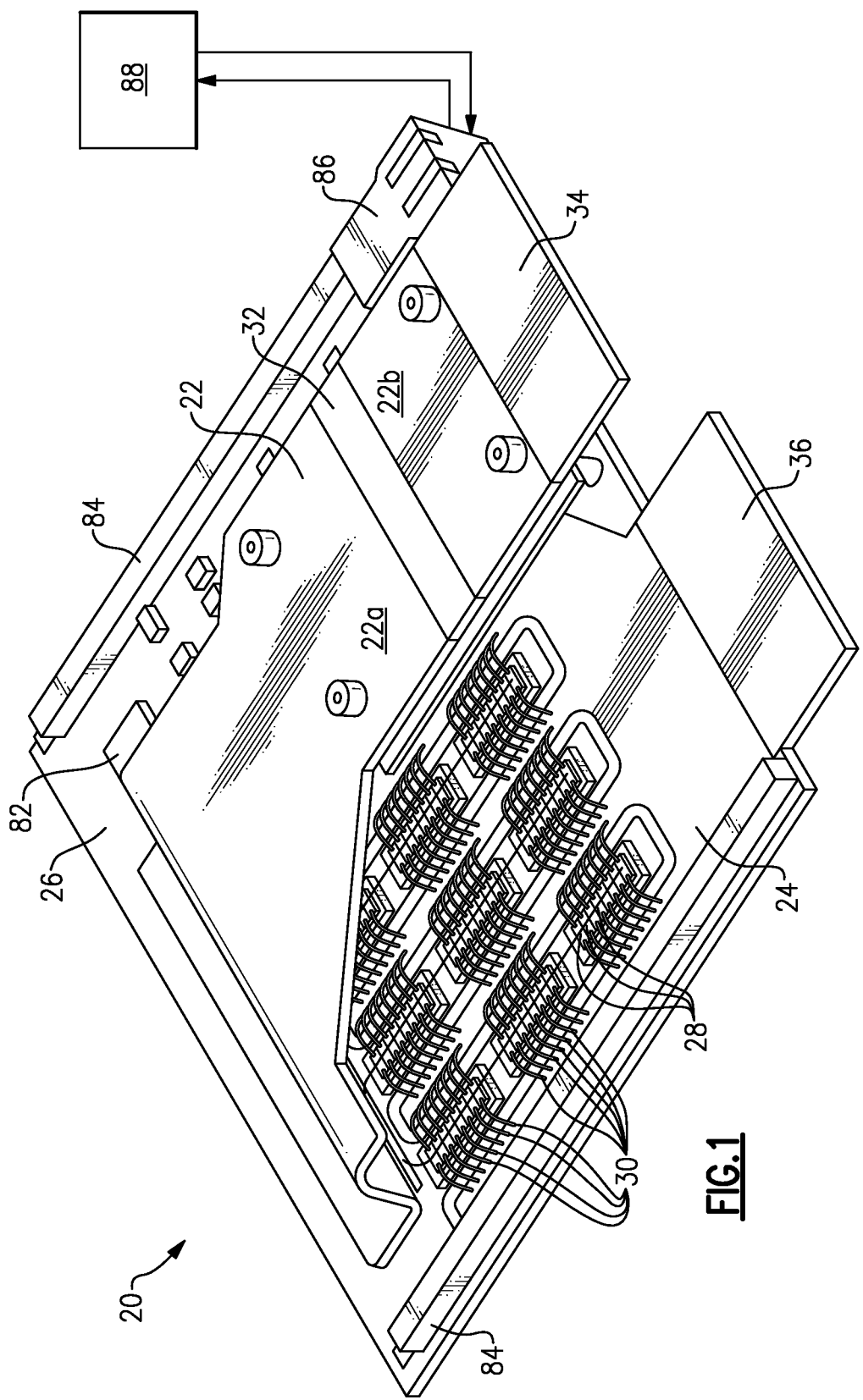
FIG. 1 schematically illustrates an example solid state contactor module.

FIG. 1 schematically illustrates an example solid state contactor module 20 that includes a first bus bar 22 and a second bus bar 24 secured to a printed circuit board 26. A plurality of solid state switches 28 are secured to and are electrically connected to the bus bar 22. In one example the solid state contactor module 20 includes 60-100 solid state switches 28. Of course, other quantities of switches could be used. In one example the solid state switches 28 are included in integrated circuit dies.

The solid state switches 28 selectively permit a flow of current between the bus bars 22, 24 through a plurality of connections 30. The connections 30 may be ribbons or bond wires, for example. In one example each of the plurality of switches 28 is connected in parallel and is operated in unison such that each of the switches 28 turns ON or OFF simultaneously to control the flow of current between the bus bars 22, 24.

Figure 2:
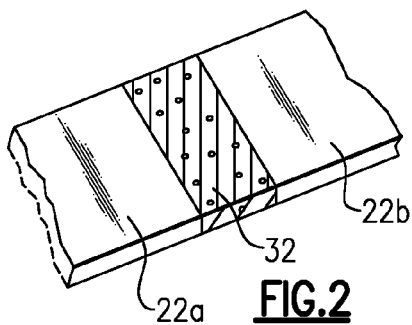
FIG. 2 illustrates a current sensor of a bus bar of FIG. 1.

A current sensor 32 is formed along a cross section of the bus bar 22 (see FIG. 1 and FIG. 2). The current sensor 32 separates the bus bar 22 into two separate portions 22a-b such that a flow of current between the bus bar sections 22a-b passes through the current sensor 32. In one example, the current sensor 32 is secured to the two separate bus bar portions 22a-b using an e-beam or friction welding process. Of course, e-beam or friction welding are only examples, and other steps could be taken to secure the bus bar portions 22a-b to the current sensor 32.

Figure 3:
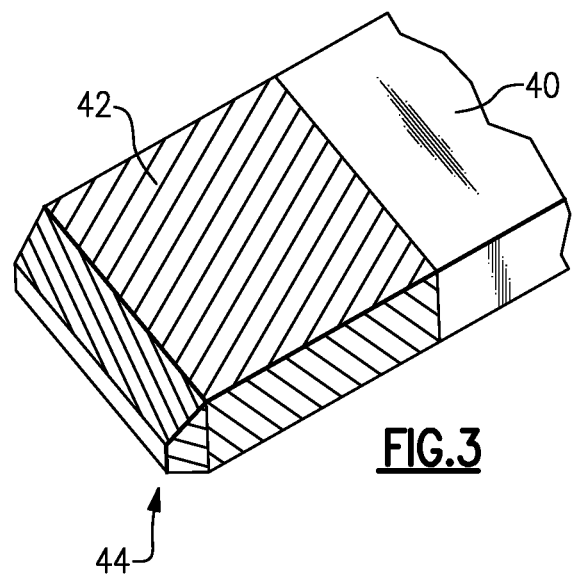
FIG. 3 illustrates a bus bar having a conductively coated end portion.

Each of the bus bars 22, 24 has an end portion 34, 36 that is coated with a conductive material. In one example the coating includes a nickel gold alloy. Of course, other coatings could be used. In one example the end portion 34, 36 may be shaped to fit into an opening. FIG. 3 illustrates a bus bar 40 having a conductively coated end portion 42. As shown in FIG. 3, the end portion 42 may have a shaped portion 44 to mate with an opening in a receptacle.

Figure 4:
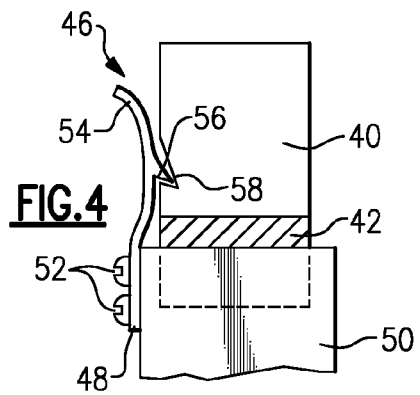
FIG. 4 illustrates an example bus bar retention configuration.

The bus bars 22, 24 may also be operable to receive a retention mechanism such that the bus bars 22, 24 can be easily secured and removed from a receptacle without the need for specialized tools. FIG. 4 illustrates an example bus bar retention configuration 46 in which a retaining arm 48 removably secures the bus bar 40 into a receptacle 50. The retaining arm 48 is secured to the receptacle 50 via fasteners 52. The retaining arm 48 includes a handle portion 54 and an extension portion 56. The extension portion 56 is received into a recess 58 in the bus bar 40. The retaining arm 54 is biased to maintain the extension portion 56 in the recess 58, and the handle portion 54 is movable to remove the extension portion 56 from the recess 58 in the bus bar 40 such that the bus bar 40 can be secured to the receptacle 50 and can be removed from the receptacle 50 without the need for any specialized tools.

Figure 5:
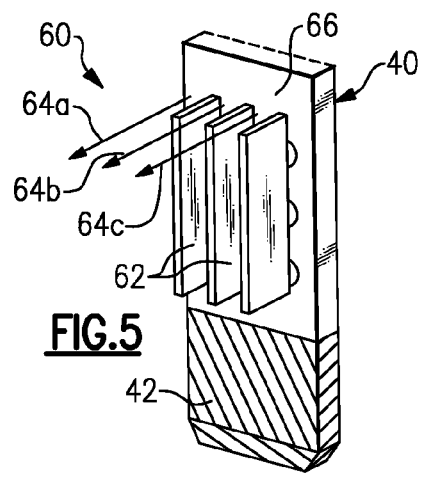
FIGS. 5-6 illustrate example bus bar heat sink configurations.
Figure 6:
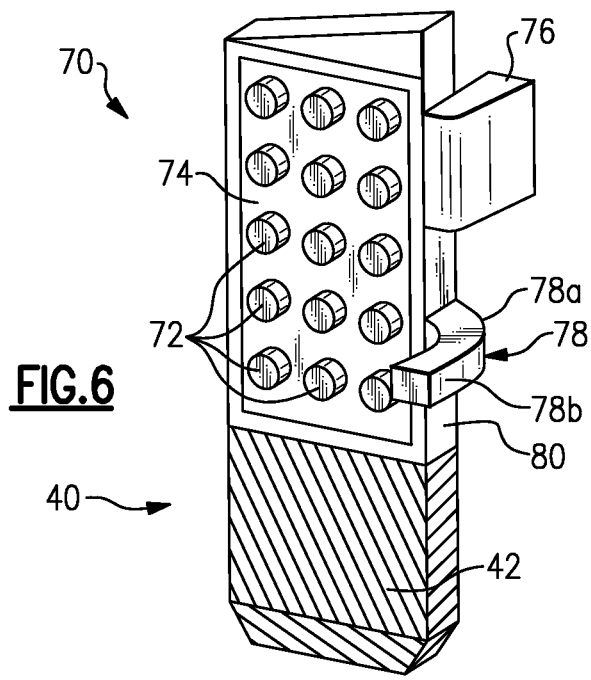

The bus bars 22, 24 may include a plurality of heat sink extensions to facilitate cooling, as shown in FIGS. 5-6. FIG. 5 illustrates an example heat sink configuration 60 for the bus bar 40 of FIG. 3 that includes a plurality of cooling fins 62. Each cooling fin 62 extends away from the bus bar 40 along an associated axis 64a-c that is transverse to a planar surface 66 of the bus bar 40. In one example each axis 64a-c is perpendicular to the planar surface 66. Each of the fins 62 acts as a heat sink, increasing the surface area of the bus bar 40.

FIG. 6 illustrates an example heat sink configuration 70 for the bus bar 40 of FIG. 3 that includes a plurality of cylindrical extensions 72 extending from a recessed first surface 74 of the bus bar 40, and a plurality of extensions 76, 78 extending from a second surface 80 of the bus bar 40. Referring to extension 78, the extensions may include a curved portion 78a and a straight portion 78b. Of course, the extensions 76, 78 are only examples and other extensions could be used. Also, various combinations of the fins 62 of FIG. 5 and the extensions 72, 76, 78 of FIG. 6 could be used to increase heat sink surface area and achieve a desired cooling effect.

Referring again to FIG. 1, the solid state contactor module 20 includes a microprocessor 82 that is in communication with the current sensor 32 and that is operable to control the solid state switches 28. In one example the microprocessor 82 includes a programmable trip function, and is operable to commands the solid state switches 28 to change states (e.g., turn from OFF to ON, turn from ON to OFF) in response to the current sensor 32 detecting an overcurrent condition. In this example the microprocessor 82 may have dedicated software algorithms stored in memory, and the trip and timing levels may be controlled by one or more of the algorithms and may be reconfigurable. In one example the algorithms include instructions for detecting serial and parallel arcing. In one example the microprocessor 82 performs load health monitoring by analyzing the flow of current through current sensor 32. Although referred to as microprocessor 82, it will be understood that the microprocessor 82 can be embodied as one or more microprocessors, microcontrollers, digital signal processors, gate arrays, and/or logic circuitry.

In one example the microprocessor 82 detects zero crossings of an AC current passing through the current sensor 32, and the microprocessor 82 only commands the solid state switches 28 to turn ON or OFF during detected zero crossings, which can reduce voltage spikes. The solid state contactor module 20 also includes a plurality of guides 84 extending longitudinally along opposite sides of the printed circuit board 26 to facilitate insertion of the printed circuit board 26 into a housing. A connector 86 facilitates communication between the microprocessor 82 and an aircraft computer 88 (e.g., a flight computer or a power distribution computer). In one example the microprocessor 82 receives instructions from the aircraft computer 88 and controls the plurality of solid state switches 28 in response to the commands received from the aircraft computer 88. In one example the connector 86 is a serial peripheral interface ("SPI"). Of course, other types of interfaces could be used.

Figure 1A:
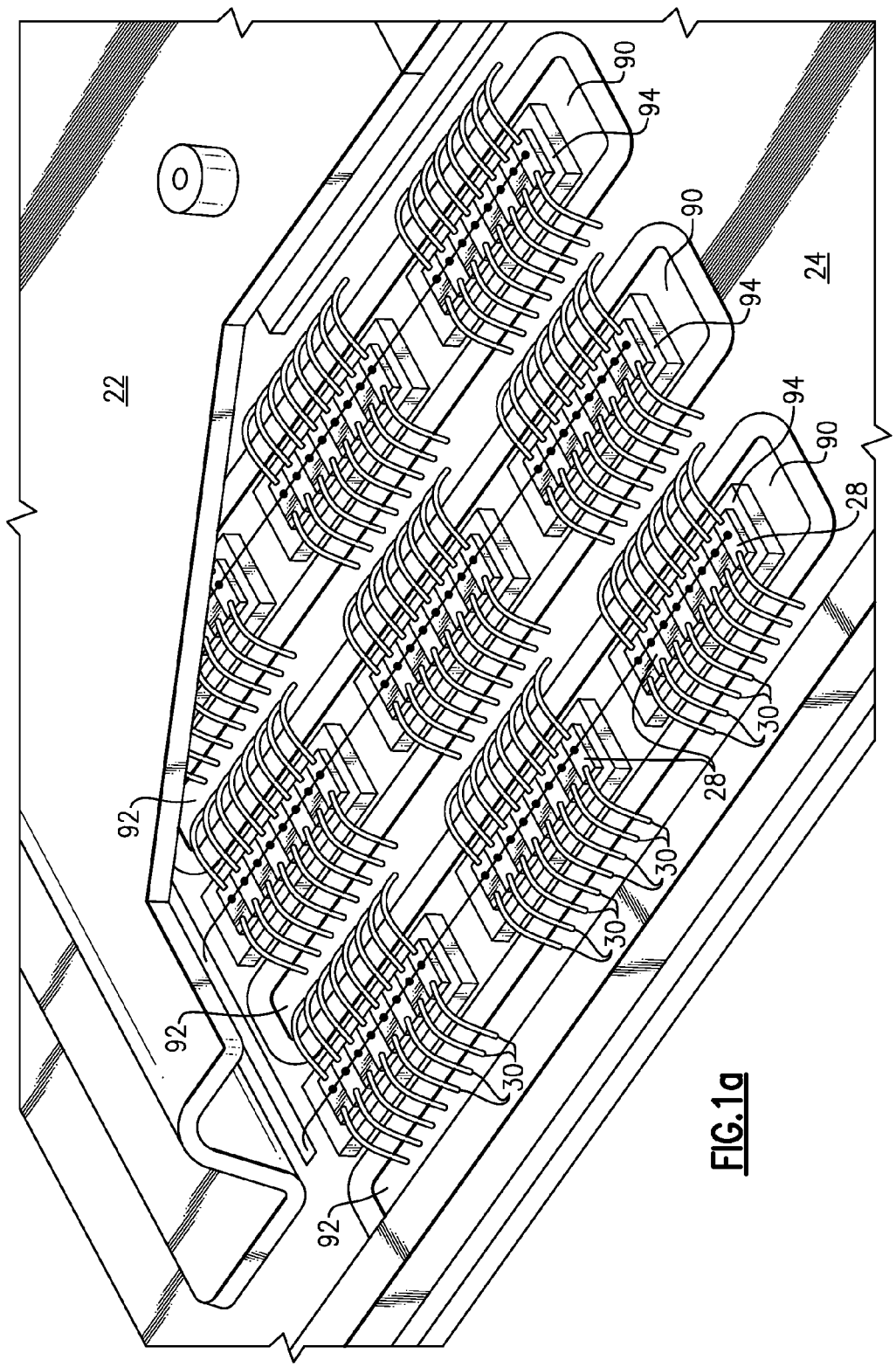
FIG. 1a illustrates a magnified portion of the solid state contactor module of FIG. 1.

FIG. 1a illustrates a magnified portion of the solid state contactor 20 of FIG. 1. As shown in the examples of FIGS. 1 and 1a, the bus bars 22 have a plurality of extensions 90 and the bus bar 24 has a plurality of extensions 92. The extensions 92, 94 interconnect with each other in a mating connection such that the connections 30 need only extend a short distance to connect the bus bars 22, 24. Of course, the mating connection of the extensions 92, 94 is only an example and other configurations would be possible.

Each of the solid state switches 28 is connected to the bus bar 22 via one of a plurality of conductive plates 94 that electrically connects the solid state switches 28 to the bus bar 22. In one example the conductive plates 94 are at least partially composed of molybdenum copper. In one example the conductive plates 94 are both thermally and electrically conductive. Also, the conductive plates 94 may provide a stress release for their associated bus bar 22, 24 by having a desired coefficient of thermal expansion ("CTE") to accommodate thermal expansion under various temperatures.

Figure 7:
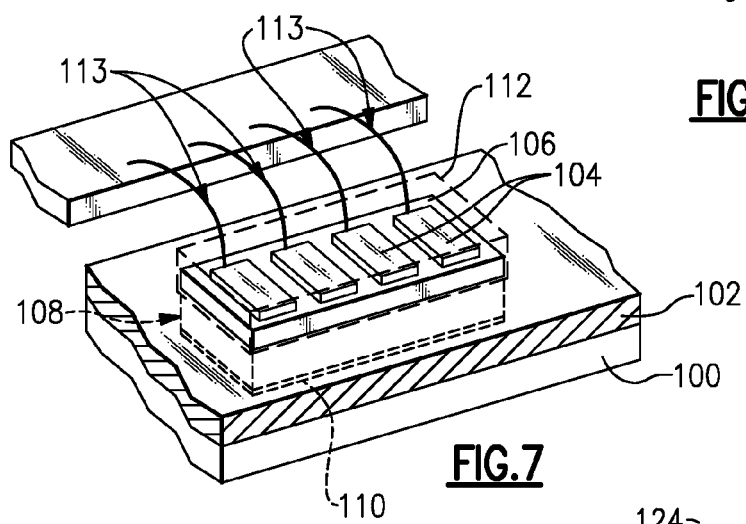
FIG. 7 schematically illustrates a bus bar having a printed circuit board lamination layer.

In one example each of the bus bars 22, 24 are laminated in a printed circuit board coating, and each of the conductive plates 94 and their associated solid state switches 28 are received into openings in the laminated coating as a "chip on bus bar" subassembly. FIG. 7 illustrates this example in greater detail. As shown in FIG. 7, a bus bar 100 includes a printed circuit board lamination layer 102. A plurality of solid state switches 104 are connected to the bus bar 100 via a conductive plate 106 that is received into an opening 108 in the layer 102. In one example the solid state switches 28 are sintered to the conductive plate 106 and the conductive plate 106 is connected to the bus bar 100 via a layer of electrically conductive glue 110. In one example the conductive plate 106 and the conductive glue 110 are chosen to have a similar CTE to minimize CTE mismatch (as CTE mismatch may result in uneven expansion). In one example a potting material 112 may be used to protect the solid state switches 104 and the conductive plate 106. In one example the potting material 112 also encloses the connections 113.

Figure 8:
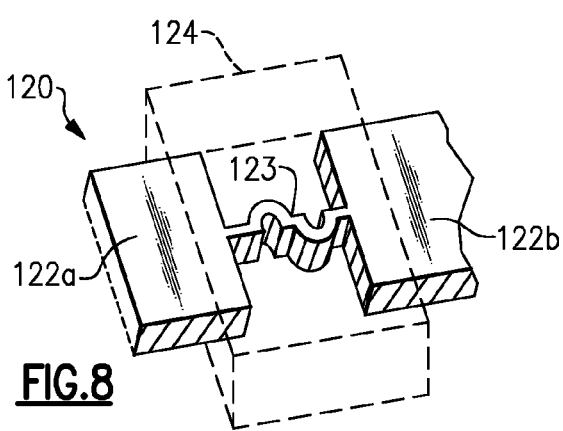
FIG. 8 schematically illustrates a bus bar fuse configuration.

FIG. 8 schematically illustrates a bus bar fuse configuration 120 in which bus bar portions 122a-b are electrically connected by a bus bar fuse connection 123 such that a current exceeding a predefined current threshold terminates the connection 123 (e.g., connection 123 is dissipated due to the heat of an overcurrent condition) such that current does not flow between the bus bar portions 122a-b. A housing 124 may be included to maintain the structural integrity of the connection between the bus bar portions 122a-b.

Figure 9:
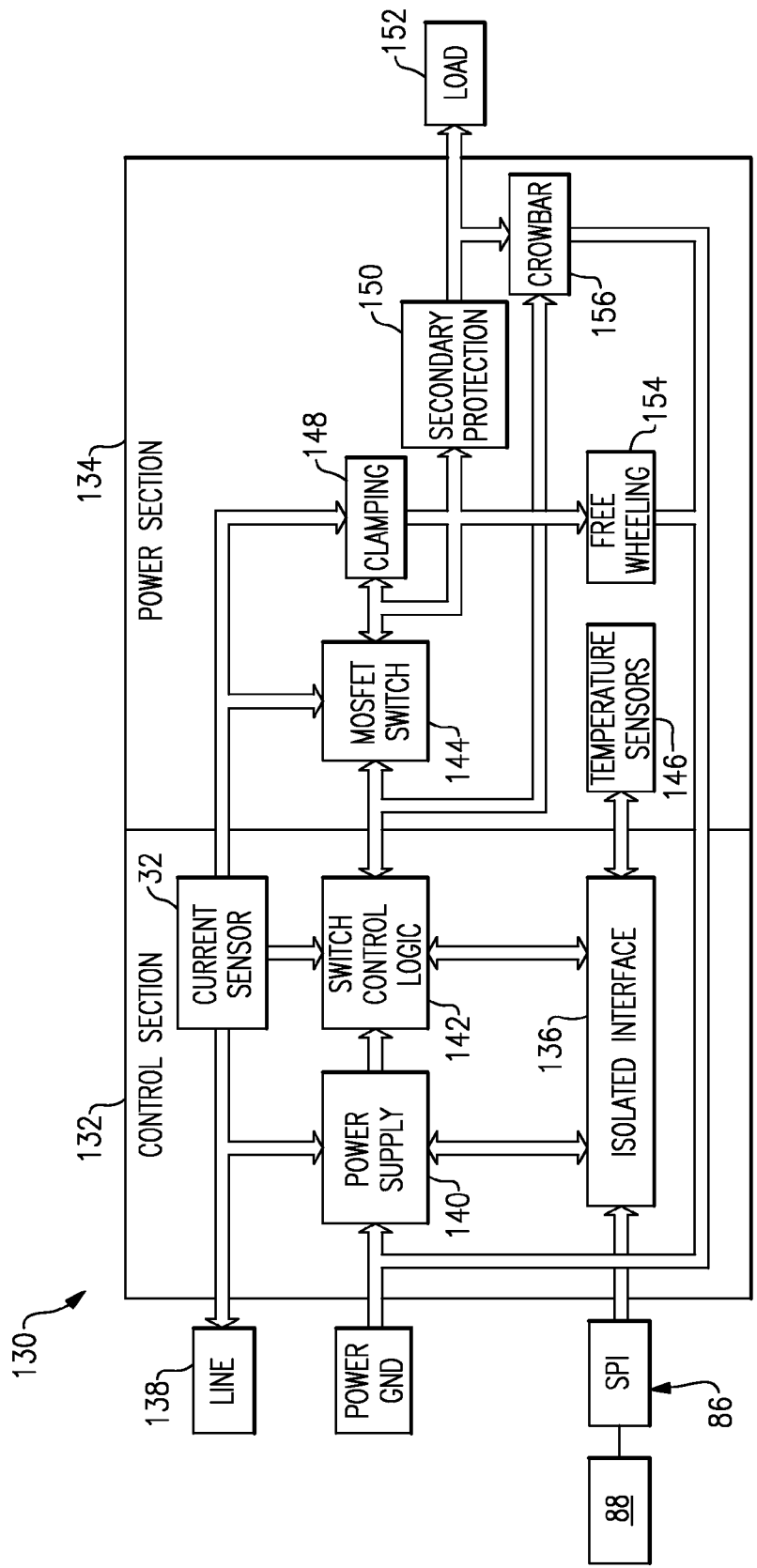
FIG. 9 schematically illustrates a solid state contactor configuration including both a control section and a power section.

FIG. 9 schematically illustrates a solid state contactor configuration 130 in which a contactor has both a control section 132 and a power section 134. The control section 132 may include an isolated interface 136 to electrically isolate aircraft computer 88 from power input line 138. A power supply 140 powers the isolated interface 136 and a switch control logic module 142. In one example the switch control logic module 142 includes the microprocessor 82 of FIG. 1. Current sensor 32 (see also FIG. 2) is operable to measure a flow of current between the power input line 138 and the power section 134, and is operable to transmit this measurement to the switch control logic 142.

The power section 134 includes at least one solid state switch 144. Although the solid state switch 144 is illustrated as a MOSFET, it is understood that other types of solid state switches could be used. A temperature sensor 146 is in communication with the isolated interface 136 and may alert the control section 132 of excessive temperature conditions, for example. A clamping module 148 protects the solid state switch 144 against overvoltage conditions (e.g., lighting, inductive load backfeed, etc.). A secondary protection module 150 protects the load 152 against excessive current conditions, and may include the bus bar fuse configuration 120 of FIG. 8.

A free wheeling module 154 prevents electromagnetic field ("EMF") and inductive load backfeed from affecting other components of the power section 134. In one example the free wheeling module 154 is implemented as a free wheeling diode. A crowbar module 156 limits a voltage output at the load 152 to an acceptable limit, and prevents excessive voltage spikes from inductive loads. In one example the crowbar module 156 is also implemented as a free wheeling diode.

Although embodiments have been disclosed, a worker of ordinary skill in this art would recognize that certain modifications would come within the scope of this disclosure. For that reason, the following claims should be studied to determine the true scope and content of this disclosure.

What is claimed is:

1. A solid state contactor assembly, comprising:
  at least one solid state switch electrically connected to a first bus bar via at least one conductive plate, the solid state switch controlling a flow of current between the first bus bar and a second bus bar;
  a current sensor formed along a cross section of one of the first or second bus bar such that the current sensor separates its associated bus bar into two separate bus bar portions and such that a flow of current between the two separate bus bar portions passes through the current sensor; and a switch control operable to control the solid state switch, wherein the switch control is in communication with the current sensor.

2. The assembly of claim 1, wherein the at least one solid state switch includes a plurality of solid state switches connected in parallel and controlled in unison to control the flow of current between the first bus bar and the second bus bar.

3. The assembly of claim 2, wherein each of the plurality of solid state switches is part of one of a plurality of integrated circuit dies.

4. The assembly of claim 2, wherein the plurality of solid state switches is connected to the first bus bar via a plurality of conductive plates.

5. The assembly of claim 4, wherein each of the first and the second bus bars are at least partially laminated with a printed circuit board coating, and wherein the plurality of conductive plates are received into openings in the laminated coating.

6. The assembly of claim 4, wherein the plurality of conductive plates is at least partially composed of molybdenum copper.

7. The assembly of claim 1, wherein the switch control commands the at least one solid state switch to change states in response to the current sensor detecting a current exceeding a current threshold.

8. The assembly of claim 1, wherein the current is an AC current, and wherein the switch control turns the at least one solid state switch ON and OFF at detected zero crossings of the AC current.

9. The assembly of claim 1, the assembly including:
a printed circuit board to which the first bus bar and the second bus bar are secured; and
at least one guide extending longitudinally along at least one side of the printed circuit board, the at least one guide facilitating insertion of the printed circuit board into a housing.

10. The assembly of claim 1, wherein the switch control includes a microprocessor operable to communicate with the at least one solid state switch and the current sensor, and operable to receive commands from an aircraft computer via a communication link.

11. The assembly of claim 10, wherein said switch controller is communicatively coupled to said current sensor and wherein said switch controller is communicatively coupled to an aircraft computer.

12. The assembly of claim 1, including:
a fuse connection providing a current path between distinct areas of a selected one of the first or second bus bar, wherein in response to an overcurrent condition the fuse connection terminates and prevents a flow of current between the distinct areas of the selected bus bar; and
a housing surrounding the fuse connection and partially surrounding the distinct areas of the selected bus bar.

13. The assembly of claim 1, wherein the solid state contactor assembly includes a control section and a power section, the control section including the current sensor and the switch control, and the power section including the at least one solid state switch, a temperature sensor operable to alert the control section of excessive temperature conditions, a clamping module operable to protect the at least one solid state switch against overvoltage conditions, a protection module operable to protect a downstream load against excessive current conditions, and at least one free wheeling module to protect the power section from inductive loads and EMF.

14. The assembly of claim 1, wherein each of said first bus bar and said second bus bar includes an end portion, and wherein said end portion is coated with a conductive material.

15. The assembly of claim 1, wherein each of said bus bars includes at least one heat sick extension.

16. The assembly of claim 15, wherein each of said heat sink extensions protrudes transverse to a planar section of the bus bar to which said heat sink extension is attached.

17. The assembly of claim 1, wherein said switch control includes a memory storing instructions for causing said switch control to detect serial and parallel arcing.

* * * * *

UNITED STATES PATENT AND TRADEMARK OFFICE
CERTIFICATE OF CORRECTION

| | |
|---|---|
| PATENT NO. | : 8,987,948 B2 |
| APPLICATION NO. | : 12/825400 |
| DATED | : March 24, 2015 |
| INVENTOR(S) | : Norbert J. Simper |

It is certified that error appears in the above-identified patent and that said Letters Patent is hereby corrected as shown below:

IN THE CLAIMS:

In claim 15, column 6, line 30; delete "sick" and replace with --sink--

Signed and Sealed this
Twenty-seventh Day of October, 2015

Michelle K. Lee
*Director of the United States Patent and Trademark Office*